United States Patent [19]
Morimoto et al.

[11] Patent Number: 4,737,829
[45] Date of Patent: Apr. 12, 1988

[54] DYNAMIC RANDOM ACCESS MEMORY DEVICE HAVING A PLURALITY OF ONE-TRANSISTOR TYPE MEMORY CELLS

[75] Inventors: Mitsutaka Morimoto; Yuji Okuto; Toshio Takeshima, all of Tokyo, Japan

[73] Assignee: NEC Corporation, Tokyo, Japan

[21] Appl. No.: 845,297

[22] Filed: Mar. 28, 1986

[30] Foreign Application Priority Data

Mar. 28, 1985 [JP] Japan ................................. 60-64541
Apr. 15, 1985 [JP] Japan ................................. 60-79656
Sep. 20, 1985 [JP] Japan ................................. 60-209474

[51] Int. Cl.⁴ ............................................ H01L 29/78
[52] U.S. Cl. .................................... 357/23.6; 357/55; 357/56; 357/59; 365/149
[58] Field of Search .................... 357/23.6, 55, 45, 59, 357/56; 365/149

[56] References Cited
U.S. PATENT DOCUMENTS

| | | | |
|---|---|---|---|
| 4,353,086 | 10/1982 | Jaccodine et al. | 357/23.6 |
| 4,462,040 | 7/1984 | Ho et al. | 357/23.6 |
| 4,679,300 | 7/1987 | Chan et al. | 357/23.6 |

FOREIGN PATENT DOCUMENTS

| | | | |
|---|---|---|---|
| 108390 | 5/1984 | European Pat. Off. | 357/23.6 |
| 3525418 | 1/1986 | Fed. Rep. of Germany | 357/23.6 |

Primary Examiner—Joseph E. Clawson, Jr.
Attorney, Agent, or Firm—Sughrue, Mion, Zinn, Macpeak & Seas

[57] ABSTRACT

A dynamic memory device having a plurality of one-transistor type memory cells is disclosed.

The memory device has a plurality of pillar-like semiconductor protrusions. The transfer gate transistor of a memory cell is formed along the upper portion of the pillar-like semiconductor protrusion such that its channel region is positioned at a side surface of the upper portion, and the storage capacitor of the memory cell is formed along the lower portion of the pillar-like semiconductor protrusion.

1 Claim, 6 Drawing Sheets

DYNAMIC RANDOM ACCESS MEMORY DEVICE HAVING A PLURALITY OF ONE-TRANSISTOR TYPE MEMORY CELLS

BACKGROUND OF THE INVENTION

The present invention relates to a dynamic random access memory device having a plurality of one-transistor type memory cells, and more particularly to a memory cell having a three-dimensional structure.

To realize a high integration in a memory device having a plurality of one-transistor memory cells each consisting of one transfer gate transistor and one storage capacitor, various new attempts have been made. For example, in the report entitled "A CORRUGATED CAPACITANCE CELL (CCC) FOR MEGABIT DYNAMIC MOS MEMORIES" by H. Sunami et al., on pages 806 and 807 of the report of IEDM held in December, 1982, part of the storage capacitor is provided by forming a groove-like recess on a single crystal substrate to reduce the cell area. However, in the memory cell, the transfer gate transistor is provided on a major surface of the substrate, and a thick field insulating layer partly embedded in the substrate is necessary for isolating each of memory cells. Therefore, the prior art structure has a restriction to further enhance the integration. Concretely, a area of about 21 microns square ($\mu m^2$) in the plan view is necessary to form one memory cell.

SUMMARY OF THE INVENTION

It is an object of the present invention to provide a memory device which realizes a high integration drastically in comparison with the prior art structure.

According to the present invention, the transfer gate transistor as well as the storage capacitor of each memory cell is formed along a pillar-like protrusions of semiconductor material. More particularly, the pillar-like semiconductor material has the area in the plan view of, for example, 1.5 $\mu m \times 1.5$ $\mu m$, and stands by keeping intervals of, for example, 1.5 $\mu m$ in one lateral direction and of, for example, 3.0 $\mu m$ in another lateral direction perpendicular to the one lateral direction with adjacent pillar-like semiconductor protrusions, respectively. In this case, each of memory cells can be formed in a small area in the plan view of 13.5 $\mu m^2$ (=(1.5+1.5) $\mu m \times (1.5+3.0)$ $\mu m$).

The dynamic memory device according to the present invention has a concrete feature which comprises a first semiconductor member of one conductivity type, and a plurality of second semiconductor members of one conductivity type each having pillar-like shape and standing perpendicularly from the first semiconductor member with predetermined intervals each other. Each of the second semiconductor member has a first impurity region of the opposite conductivity type formed in side surfaces of the second semiconductor member except side surfaces of an upper portion of the second semiconductor member and a second impurity region of the opposite conductivity type formed in an upper surface of the second semiconductor member such that the second impurity region is separated from the first impurity region. First thin insulating films surround respective the second semiconductor members and provided on respective the second impurity regions. A third semiconductor member of one conductivity type is formed on the first semiconductor member and fills the intervals between respective the second semiconductor members such that the third semiconductor member is contacted to respective the first insulating films. Second thin insulating films are formed on at least one side surface of the upper portion of respective the second semiconductor members. A first conductive member is provided on the second thin insulating films of a group of the second semiconductor members, and a second conductive member is connected to the second impurity regions of a group of the second semiconductor members. According to the structure mentioned above, the third semiconductor member, the first thin insulating film and the first impurity region constitute a MOS capacitor of a memory cell, and the second impurity region, the upper portion of the second semiconductor member, the second thin insulating film, the first impurity region and a part of the first conductive member constitute a transfer gate transistor of the memory cell. the first conductive member is a word line, and the second conductive member is a bit line.

A pair of the first conductive members may extend with a constant interval each other by interposing an insulating layer therebetween, and both outer side surfaces of the pair of the first conductive members are contacted to the second thin insulating films of corresponding memory cells to form a folded-bit line type memory device.

The feature can be so modified that the memory device comprises a first semiconductor member of one conductivity type, and a plurality of second semiconductor member of the opposite conductivity type having pillar-like shape and standing perpendicularly from the first semiconductor member with predetermined intervals each other. First thin insulating films are formed on side surfaces of respective the second semiconductor members. A third semiconductor member of one conductivity type is formed on the first semiconductor member and fills the intervals between respective the second semiconductor members such that the third semiconductor member is contacted to respective the first thin insulating films. An insulating layer is formed on the second and third semiconductor member, and openings are provided in the insulating layer to expose parts of the upper surface of the second semiconductor members and parts of the upper surface of the third semiconductor member.

A first conductive member extends in a first direction on the insulating layer. Second thin insulating films are formed on both sides of the first conductive member. Fourth semiconductor members are formed on the second thin insulating film and within the openings. Each of the fourth semiconductor members includes a first part of one conductivity type contacted to the upper surface of the third semiconductor member through the opening and to the second thin insulating film, a second part of the opposite conductivity type contacted to the upper surface of the second semiconductor member through the opening and a third part of the opposite conductivity type formed on the upper surface of the fourth semiconductor member. A second conductivity member extends in a second direction and connects to the third impurity regions of a group of the fourth semiconductor members. Accordingly, the second semiconductor member, the first thin insulating film and the third semiconductor member constitute a MOS capacitor of a memory cell, and the first, second and third impurity parts of the fourth semiconductor member, the second thin insulating film, and a part of the first conductive member constitute a transfer gate transistor of the memory cell. The first conductive member is a word line, and the second conductive member is a bit line.

DESCRIPTION OF THE EMBODIMENTS

Figure 1A:
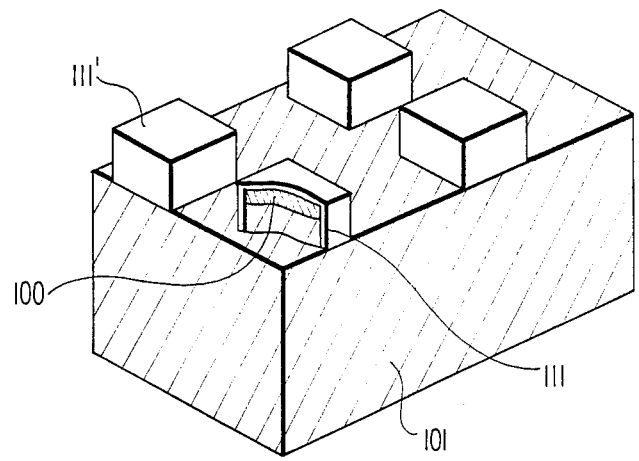
FIGS. 1A to 1F are partially cut-away perspective views showing process steps sequentially of one method for manufacturing a first embodiment of the present invention.
Figure 1B:
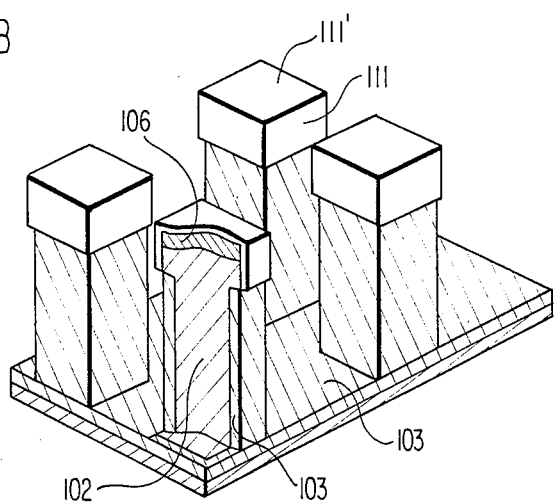
Figure 1C:
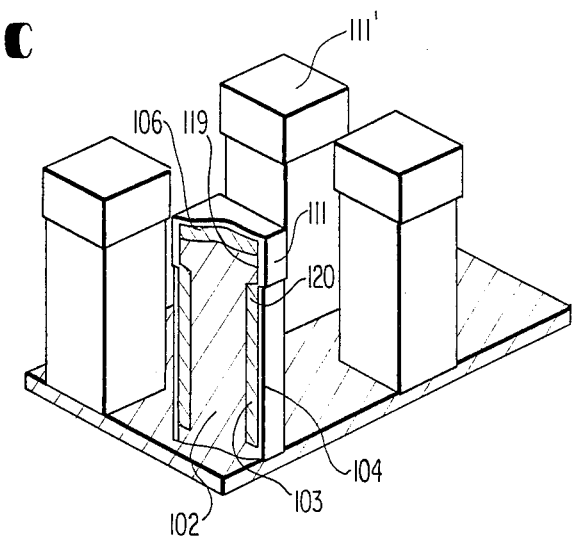
Figure 1D:
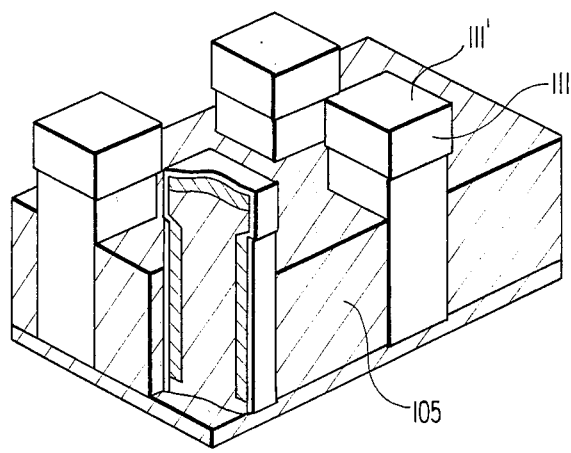
Figure 1E:
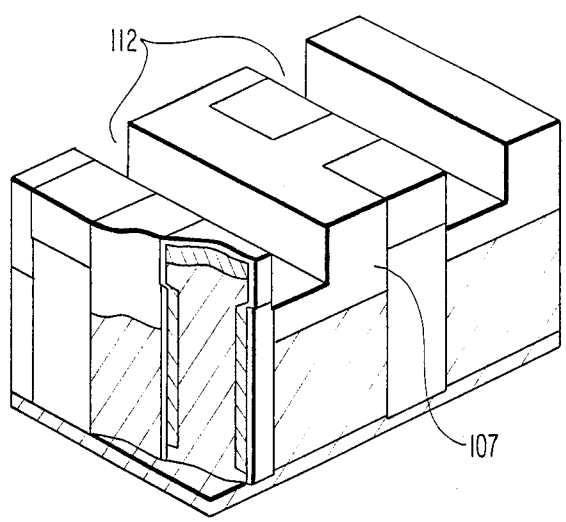

Referring to FIG. 1A, a p-type monocrystalline silicon substrate 101 is prepared, which has an impurity concentration of $5 \times 10^{16}$ atoms/cm$^3$, and an N-type impurity layer 106 of 0.5 μm thickness is entirely formed in a upper surface of the substrate 101. A mask pattern 111' of thick silicon oxide having aobut 1.0 μm thickness is provided on the N-type impurity layer 106 and an anti-isotropic reactive ion etching is conducted by using the thick silicon oxide layers 111' as a mask. Through the etching process step, the exposed portion of the substrate is removed up to about 2 μm. A thin silicon oxide film 111 of 0.1 μm thickness is entirely formed over the entire exposed surface of the substrate 101 by thermal oxidation method. An anti-isotropic reactive ion etching is conducted again. Through the etching process, parts of the thin silicon oxide film on the upper surface, that is, the bottom surfaces of the recesses of the substrate are etched away, with parts of the thin silicon oxide film 111 on the side surfaces of the protrusions of about 2 μm height being left. Through these etching process steps the thickness of the thick silicon oxide layers 111' becomes about 0.8 μm. Each of protrusions has a square shape in the plan view of 1.5 μm × 1.5 μm and arranged with 4.5 pitch in one direction and 3.0 μm pitch in the other direction right angles to the one direction. A number of protrusions are formed at positions in which respective memory cells are to be formed, although four of them are shown in FIGS. 1A to 1F. Therefore, for a 1 Mbit memory, 1,048,576 protrusions are at least formed. Next, referring FIG. 1B, the substrate 101 is further etched away by about 6 μm through the anti-isotropic reactive ion etching by using the thick silicon oxide layers 111' as a mask to form pillar-like protrusions 102 of each 8 μm thick of the present invention, and an N-type shallow impurity region 103 is entirely formed by thermal diffusion of arsenic. Then, referring to FIG. 3C, the anti-isotropic reactive ion etching is again conducted by using the silicon oxide layers 111' as a mask to remove a portion of the N-type impurity region 103 at the bottom of the substrate, with portions of the N-type impurity region 103 at the side surfaces of the pillar-like semiconductor protrusions 102 being left. Thin insulating films 104 of silicon oxide is only provided on the side surfaces of the pillar-like structures by using thermal oxidation method and the anti-isotropic reactive ion etching method. Finally, the thickness of the silicon oxide layers 111' used as etching mask become 0.1 to 0.2 μm. the insulating film 104 and the N-type impurity region 103 are employed as a dielectric film and a inversion layer of a storage capacitor, respectively. On the other hand, the N-type impurity region 106 is employed as a source or drain region connected to a bit line of a transfer gate transistor. A P-type surface portion 119 between the N-type impurity regions 103, 106 is used as a channel region of the transistor and an end part 120 of the N-type impurity region 103 is used as drain or source region of the transistor. The insulating film 104 may be a composed film of silicon oxide and silicon nitride formed by CVD process. Then, referring to FIG. 1D, a P-type silicon layer 105 is grown by a selective epitaxial gronw method or a CVD method to fill the intervals of the pillar-like semiconductor protrusions up to a depth of 5 μm. Then, referring to FIG. 1E, the residual portion above the P-type silicon layer 105 is filled by a silicon oxide layer 107 by a RF spatter method or a painting method of silica film. Thereafter, grooves 112 are formed in the silicon oxide layer 107 and parts of the insulating films 111 are removed to expose at least the P-type surface portions 119 of the pillar-like semiconductor protrusions. Finally, referring to FIG. 1F, after insulating films 109 are newly formed on the surface portions 119 as gate insulating films of respective transistors, N$^+$-type polycrystalline silicon layers 108 are formed in the grooves 112 to form word lines and form gate electrodes on the gate insulating films 109. The material of layer 108 can be replaced to tungsten, molbdenum, titanum or the like. After the silicon oxide layers 111' are removed and an insulating layer 121 is deposited, bit lines 110 of aluminum are formed on the insulating layer 121 and connected to corresponding N-type impurity regions 106 through openings (not shown) provided in the insulating layer 121. The bit lines 110 extend in a direction right angles to the direction of the word lines 108.

According to the present invention, the transfer gate transistor is formed in one pillar-like semiconductor protrusion with the storage capacitor. Therefore, a high integration can be expected in comparison with the prior art structure in which the transistor is of a planar type. Referring to FIG. 1F again, the insulating film 104 may be formed over the PN junction 122 as shown in a numeral 104a. On the other hand, the film 104 may be provided such that it covers partly the PN junction 122 as shown in a numeral 104b. According the embodiment the capacity of the storage capacitance can be estimated as the PN junction capacitance by the PN junction 122 and the MOS capacitance by the N-type impurity region 103, the insulating film 104 and the P-type semiconductor member 105 as the common electrode of all memory cells. The area of the storage capacitor becomes a sufficient large value such as 30 μm$^2$ or more by increasing the height of the pillar-like protrusion, and therefore the sufficient immunity against α particles is obtained. Further, to avoid the short channel effect the channel length can be 1 μm or more without sacrificing the integration. Moreover, the depletion layer produced from the PN junction 122 formed by the N-type inversion region 103 and the P-type region of the pillar-like protrusion only extends within the pillar-like protrusion. Therefore, any isolation means such as a thick field oxide layer for isolating one memory cell and adjacent memory cell is not necessary.

Figure 1F:
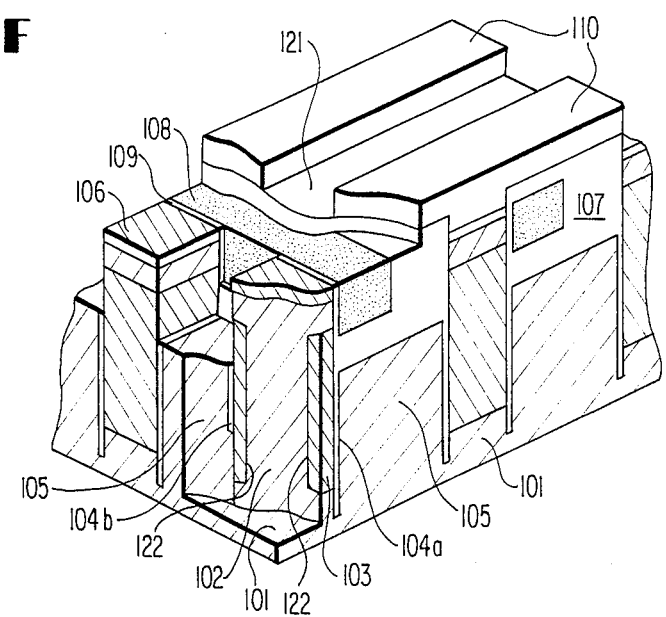
Figure 2:
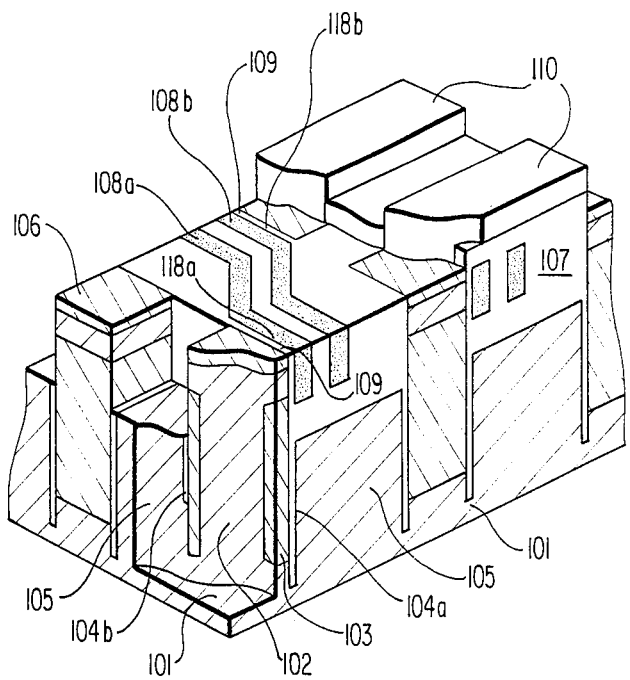
FIGS. 2 and 3 are partially cut-away perspective views showing second and third embodiments of the present invention, respectively.
Figure 3:
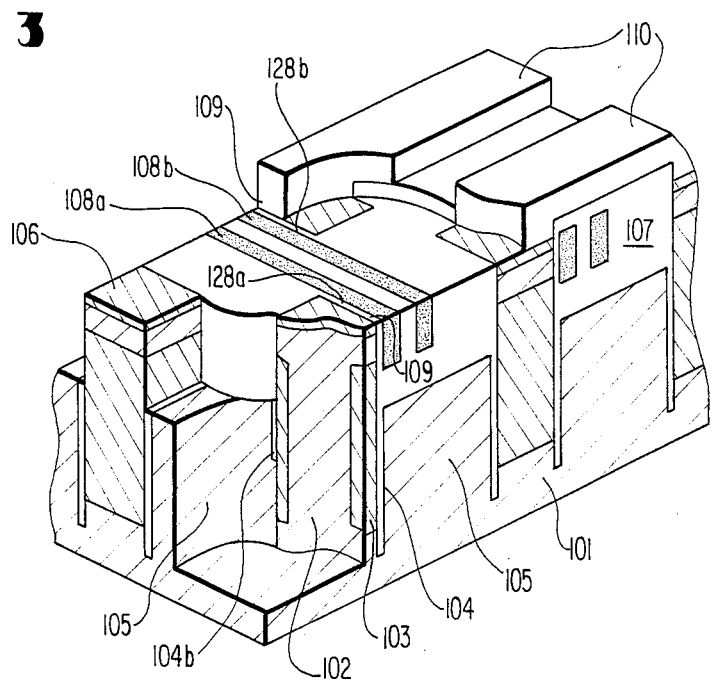

The first embodiment has been explained about an open-bit line arrangement device. Second and third embodiments in FIGS. 2 and 3 are shown holded-bit line type memory devices, respectively. In FIGS. 2 and 3, in which components like those of FIGS. 1A to 1F have been indentified with like numerals. In FIG. 2, a pair of word lines 108a, 108b extend in a sine wave-like shape with a constant interval such that the outer face 118a, 118b are contacted to the gate insulating films 109 of alternate memory cells, that is, alternate pillar-like protrusions belonging to a row or column line, respectively. On the other hand, in FIG. 3, a pair of word lines 108a, 108b extend straightly in parallel each other, and memory cells, that is, pillar-like semiconductor protrusions are alternately changed their positions such that the outer faces 128a, 128b of the word lines 108a, 108b are contacted to the gate insulating films 109 of alternate memory cells.

Figure 4A:
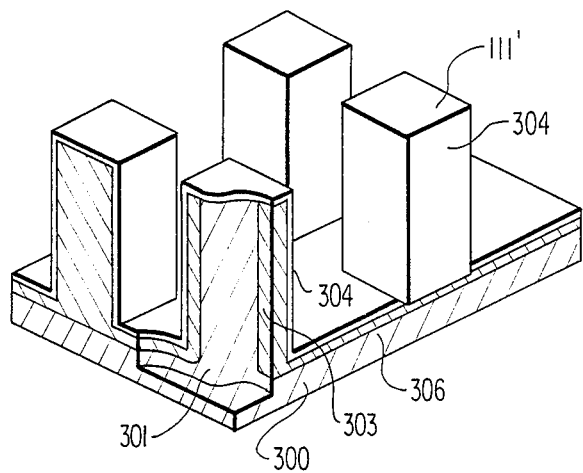
FIGS. 4A to 4C are partially cut-away perspective views showing process steps sequentially of another method for manufacturing the first embodiment.
Figure 4B:
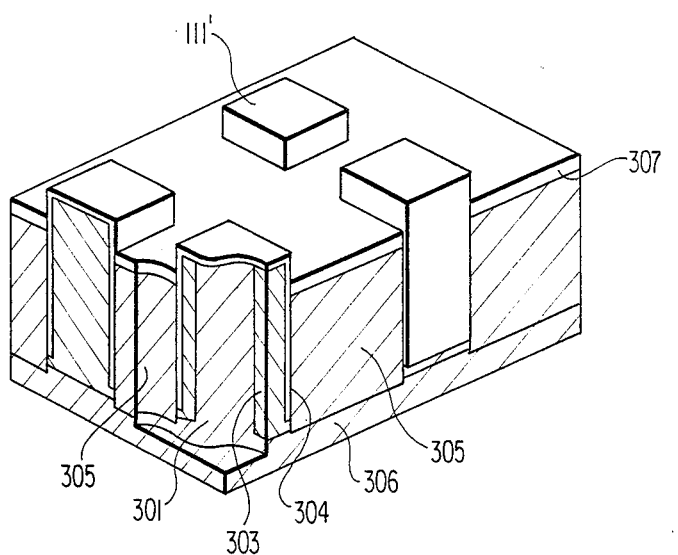
Figure 4C:
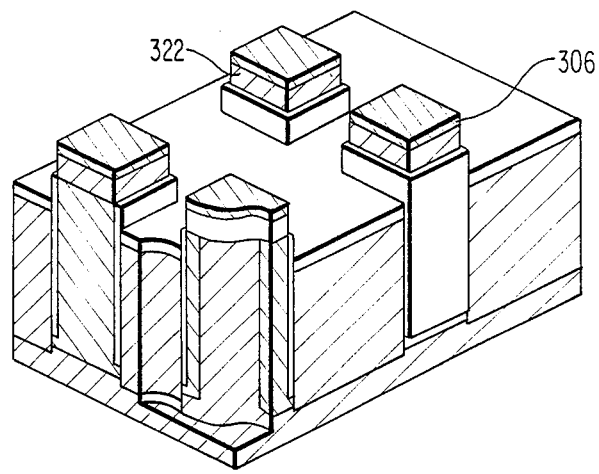

Next, another method for forming the first embodiment shown in FIG. 1F will be explained. Referring to FIG. 4A, by an anti-isotropic plasma reactive ion etching method, a monocrystalline silicon substrate 300 of P-type having a impurity concentration of $5 \times 10^{16}$ atoms/cm$^3$ is selectively removed by using thick silicon oxide layers 111' having a thickness of 1.0 μm as a mask to form pillar-like semiconductor protrusions 301 having a height of 6 μm. An N-type impurity such as arsenic is thermally doped to form an N-type region 303, and a thin insulating film 304 such as of silicon oxide or/and silicon nitride is entirely formed. Thereafter, referring to FIG. 4B, the anti-isotropic reactive ion etching is conducted by using the silicon oxide layers 111' as a mask. Through the etching process step portions of the impurity region 303 and the insulating film 304 above the bottom 306 of the substrate are selectively removed, and in this process step the bottom is also somewhat etched away. Portions of the impurity regions 303 and the insulating films 304 on the side surfaces of the pillar-like protrusion are left. A P-type silicon layer 305 is deposited on the bottom 306 to fill the intervals between the pillar-like protrusions by a selective epitaxial grown method using SiH$_2$Cl$_2$ and HCl gasses or by a CVD method up to a height of 5 μm. An insulating layer 307 is formed on the P-type silicon layer 305. Then, as shown in FIG. 4C, after the silicon oxide layers 111' are removed from the upper surfaces of the pillar-like protrusions, P-type monocrystalline silicon layers 322 of 1 μm thick and N-type monocrystalline silicon layers 306 of 0.5 μm thick are formed continuously on the exposed upper surfaces of the pillar-like protrusions by a selective epitaxial grown method. Then, the upper surfaces of the N-type silicon layers 306 and side surfaces of the layers 322, 306 are covered by thin insulating films such as the insulating films 111 shown in FIG. 1D. Thereafter, the same process steps are conducted as these shown in FIGS. 1E and 1F.

Figure 5:
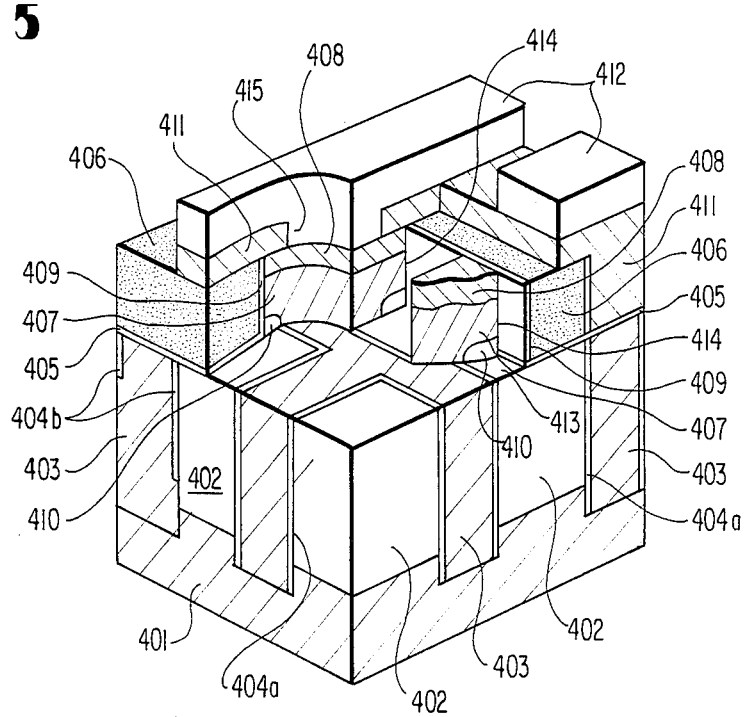
FIG. 5 is partially cut-away perspective view showing a fourth embodiment of the present invention.

Referring to FIG. 5, another feature of the present invention is disclosed. The memory device comprises a first semiconductor member 401 of P-type monocrystalline silicon and a plurality of second semiconductor member 402 of N-type monocrystalline silicon having pillar-like shape and standing perpendicularly from the upper surface of the first semiconductor member 401. In FIG. 5, only four memory cells are disclosed, and therefore the number of disclosed the second semiconductor member 402 is also four. First insulating films 404a are formed on all side surfaces of respective the second semiconductor members 402 such that the first insulating films 404a surround the second semiconductor members 402. A third semiconductor member 403 of P-type monocrystalline silicon is formed on the first semiconductor member 401 and fills the intervals between respective the second semiconductor members such that it is contacted to the first insulating films 404a. If the first insulating film is formed on all side surfaces of the second semiconductor member 402 as indicated by numeral 404a, the MOS capacitor of the memory cell is constituted by the second semiconductor member 402, the first insulating film 404a and the third semiconductor member 403, and the PN junction capacitor of the memory cell is constituted by the PN junction formed between the bottom of the second semiconductor member 402 and the first semiconductor member 401. On the other hand, if the first insulating film is formed on side surfaces of an upper portion of the second semiconductor member 402 as indicated by numeral 404b, the MOS capacitor of the memory cell is constituted by the second semiconductor member 402, the first insulating film 404b and the third semiconductor member 403, and the PN junction capacitor of the memory cell is constituted by the PN junctions formed between the bottom of the second semiconductor member 402 and the first semiconductor member 401 and formed between the side surfaces of the lower portion of the second semiconductor member 402 free from the first insulating film 404b and the third semiconductor member 403. An insulating layer 405 is entirely formed on the second and third semiconductor members 402, 403 where upper surface are co-planar with each other as shown in FIG. 5, and openings 413 are provided in the insulating layer 405 to expose parts of the upper surfaces of the second and third semiconductor members. First conductive members 406 of polycrystalline silicon are formed on the insulating layer 405. The first conductive members 406 are employed as gate electrodes of transfer gate transistor of respective memory cells and also employed as word lines of the memory device. Second thin insulating films 409 are formed on both sides of the first conductive member as gate insulating films. Fourth semiconductor members 407 of P-type monocrystalline silicon are formed on the second thin insulating films 409 by selective epitaxial grown method and well known photolithography method and opeings 413 are formed. First and second N-type impurity regions 410, 408 are formed at the lower and upper portions of the fourth semiconductor member 407. These impurity regions are used as source, drain regions of the transistors, and parts 414 between the impurity regions are used as channel regions of the transistors of respective memory cells. The lower impurity regions 410 can be formed by N-type impurity diffusion from the respective second semiconductor members 402. The upper impurity regions 408 are formed by well-known thermal diffusion process or ion-implantation process. An insulating layer 411 is entirely formed, and second conductive members 412 of aluminum are formed on the insulating layer 411. The second conductive members 412 are used as bit lines of the memory devices and connected to the N-type impurity regions 408 of corresponding memory cells through contact holes 415 provided in the insulating layer 411.

What is claimed is:

1. A dynamic memory device comprising a semiconductor substrate of one conductivity type, a first pillar-like semiconductor portion of said one conductivity type connected to said substrate and extending upwardly from the surface of said substrate, a first impurity region of the opposite conductivity type formed at an upper end surface of said first pillar-like semiconductor portion, said first impurity region extending to an upper-most side surface of said first pillar-like semiconductor portion, a second impurity region of said opposite conductivity type formed at a lower side surface of said first pillar-like semiconductor portion with a region of said one conductivity type of said first pillar-like semiconductor portion being exposed at the upper side surface of said first pillar-like semiconductor portion between said first and second impurity regions, a first thin insulator film covering the exposed region of said one conductivity type at the upper side surface of said first pillar-like semiconductor portion, a second thick insulator film adjacent to said first thin insulator film and covering an upper part of said second impurity region, a third thin insulator film adjacent to said second thick insulator film and covering a lower part of said second impurity region, a second pillar-like semiconductor portion of said one conductivity type connected to said substrate and extending upwardly from the surface of said substrate to a height lower than said first pillar-like semiconductor portion, said second pillar-like semiconductor portion being located adjacently to said first pillar-like semiconductor portion via said third thin insulator film, the upper surface of said second pillar-like semiconductor portion being covered by said second thick insulator film, a bit line conductor connected to said first impurity region, and a word line conductor formed above said second pillar-like semiconductor portion and in contact with both of said first thin insulator film and said second thick insulator film, whereby a memory cell transistor is constituted by said first and second impurity regions, said region of one conductivity type between said first and second impurity regions, said first thin insulator film and said word line conductor and a memory cell capacitor is formed by said second impurity region, said third thin insulator film, said second pillar-like semiconductor portion and said first pillar-like semiconductor portion which is electrically connected to said second pillar-like semiconductor portion via said substrate.

* * * * *

UNITED STATES PATENT AND TRADEMARK OFFICE
CERTIFICATE OF CORRECTION

PATENT NO. : 4,737,829

DATED : April 12, 1988

INVENTOR(S) : MORIMOTO et al

It is certified that error appears in the above-identified patent and that said Letters Patent is hereby corrected as shown below:

COLUMN 4, LINE 14    Delete "gronw" and insert --grown--;

COLUMN 6, LINE 44    Delete "opeings" and insert --openings--;

Signed and Sealed this

Fifteenth Day of November, 1988

Attest:

DONALD J. QUIGG

Attesting Officer          Commissioner of Patents and Trademarks